US006861277B1

(12) United States Patent
Monroe et al.

(10) Patent No.: US 6,861,277 B1
(45) Date of Patent: Mar. 1, 2005

(54) METHOD OF FORMING MEMS DEVICE

(75) Inventors: Michael G. Monroe, Corvallis, OR (US); Eric L. Nikkel, Philomath, OR (US); Dennis M. Lazaroff, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/677,539

(22) Filed: Oct. 2, 2003

(51) Int. Cl.$^7$ .............................................. H01L 21/00

(52) U.S. Cl. ....................... 438/48; 438/22; 359/291; 427/255.6

(58) Field of Search ................................. 438/7, 17, 22, 438/29, 48; 359/223–224, 291; 427/255.6

(56) References Cited

U.S. PATENT DOCUMENTS

| | | | |
|---|---|---|---|
| 5,485,304 | A | 1/1996 | Kaeriyama |
| 5,583,688 | A | 12/1996 | Hornbeck |
| 5,631,782 | A | 5/1997 | Smith et al. |
| 5,646,768 | A | 7/1997 | Kaeriyama |
| 5,650,881 | A | 7/1997 | Hornbeck |
| 5,703,728 | A | 12/1997 | Smith et al. |
| 5,919,548 | A | 7/1999 | Barron et al. |
| 6,025,951 | A | 2/2000 | Swart et al. |
| 6,038,056 | A | 3/2000 | Florence et al. |

(List continued on next page.)

FOREIGN PATENT DOCUMENTS

| | | |
|---|---|---|
| EP | 1093143 | 4/2001 |
| JP | 2000314634 | 7/2001 |

OTHER PUBLICATIONS

J.H. Smith et al., "Material and Processing Issues for the Monolithic Integration of Microelectronics with Surface-Micromachined Polysilicon Sensors and Actuators" SPIE, Oct. 1995, pp. 1–10.

Oliver Brand, "CMOS–based MEMS/DTU PhD Course/Topics in Microelectronics", Physical Electronics Laboratory, ETH Zurich, http://www.iqe.ethz.ch/pel, slides A–2 through A–36.

J.H. Smith et al., "Embedded Micromechanical Devices for the Monolithic Integration of MEMS with CMOS", 1995 IEEE, pp. 609–612.

Bikram Baidaya et al., "Layout Verification and Correction of CMOS–MEMS Layouts", Carnegie Mellon University, Pittsburgh.

Jeffrey D. Zahn et al., A Direct Plasma Etch Approach to High Aspect Ratio Polymer Micromachining With Applications in Biomems and CMOS–MEMS, 2002 IEEE, pp. 137–140

Jim Hunter et al., "CMOS friendly MEMS manufacturing process", 1998 IEEE, pp. 103–104.

*Primary Examiner*—Dung a. Lee

(57) ABSTRACT

A method of forming a MEMS device includes depositing a conductive material on a substructure, forming a first sacrificial layer over the conductive material, including forming a substantially planar surface of the first sacrificial layer, and forming a first element over the substantially planar surface of the first sacrificial layer, including communicating the first element with the conductive material through the first sacrificial layer. In addition, the method includes forming a second sacrificial layer over the first element, including forming a substantially planar surface of the second sacrificial layer, forming a support through the second sacrificial layer to the first element after forming the second sacrificial layer, including filling the support, and forming a second element over the support and the substantially planar surface of the second sacrificial layer. As such, the method further includes substantially removing the first sacrificial layer and the second sacrificial layer, thereby supporting the second element relative to the first element with the support.

27 Claims, 11 Drawing Sheets

U.S. PATENT DOCUMENTS

| | | |
|---|---|---|
| 6,121,552 A | 9/2000 | Brosnihan et al. |
| 6,323,982 B1 | 11/2001 | Hornbeck |
| 6,396,368 B1 | 5/2002 | Chow et al. |
| 6,440,766 B1 | 8/2002 | Clark |
| 6,469,330 B1 | 10/2002 | Vigna et al. |
| 6,480,320 B2 | 11/2002 | Nasiri |
| 6,523,961 B2 | 2/2003 | Ilkov et al. |
| 2002/0039470 A1 | 4/2002 | Braun et al. |
| 2003/0034535 A1 | 2/2003 | Barenburg et al. |
| 2004/0156090 A1 * | 8/2004 | Patel et al. .............. 359/291 |

* cited by examiner

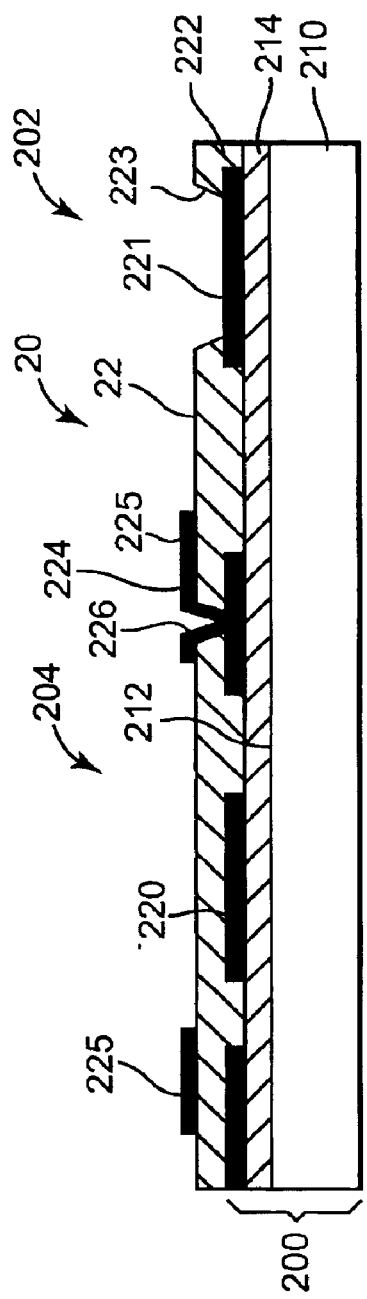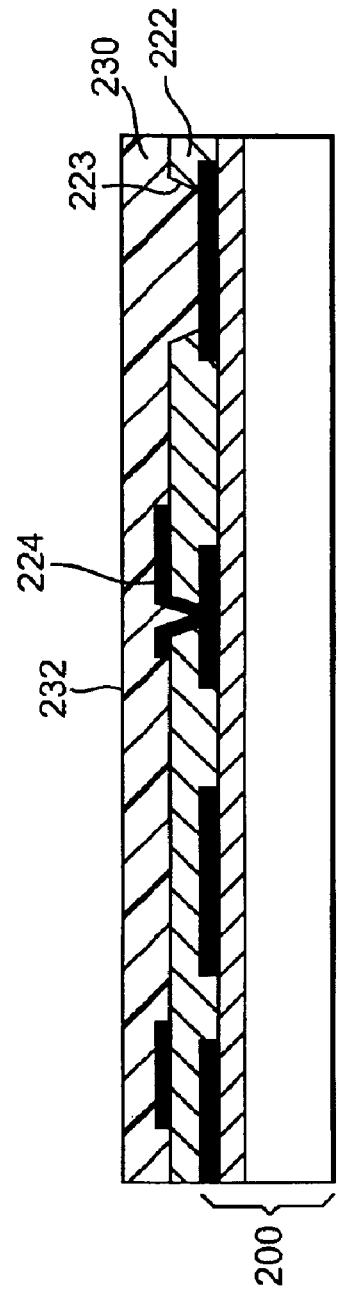
Fig. 5A
Fig. 5B

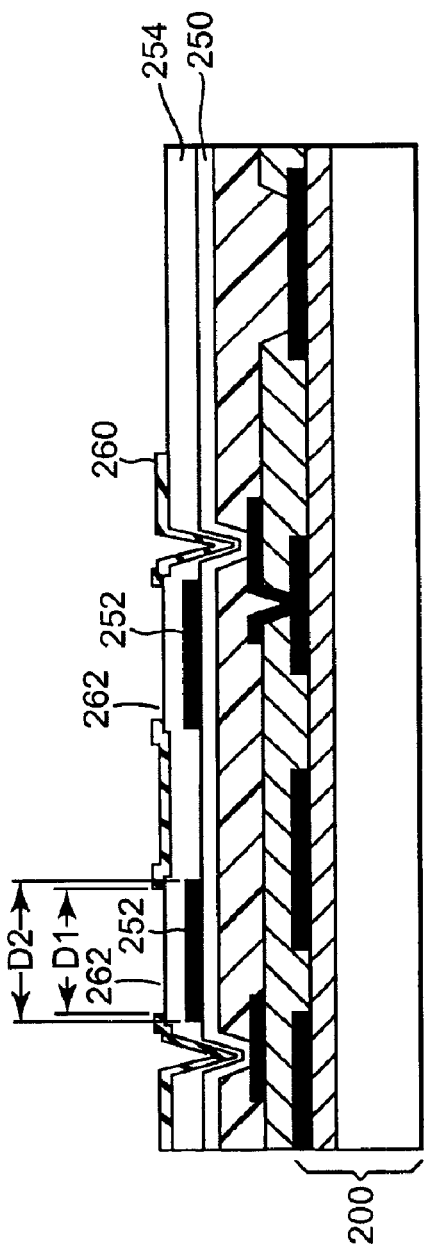
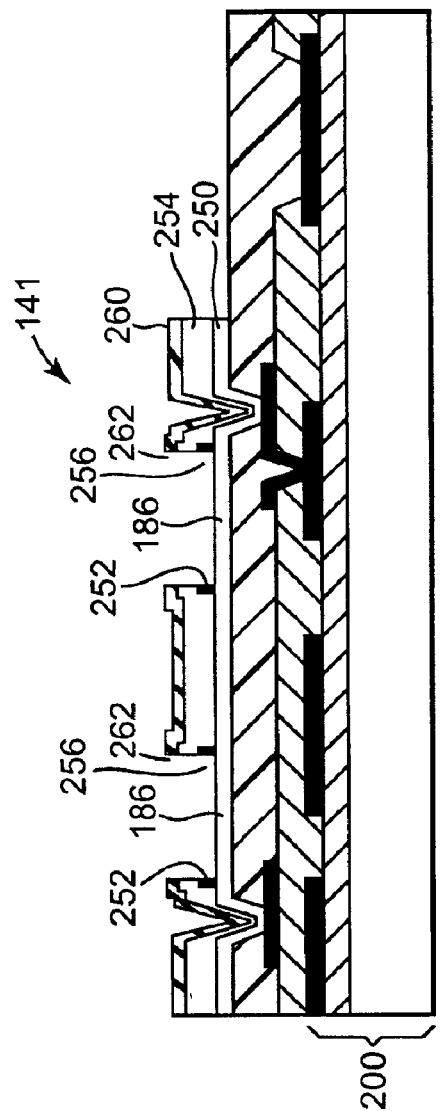

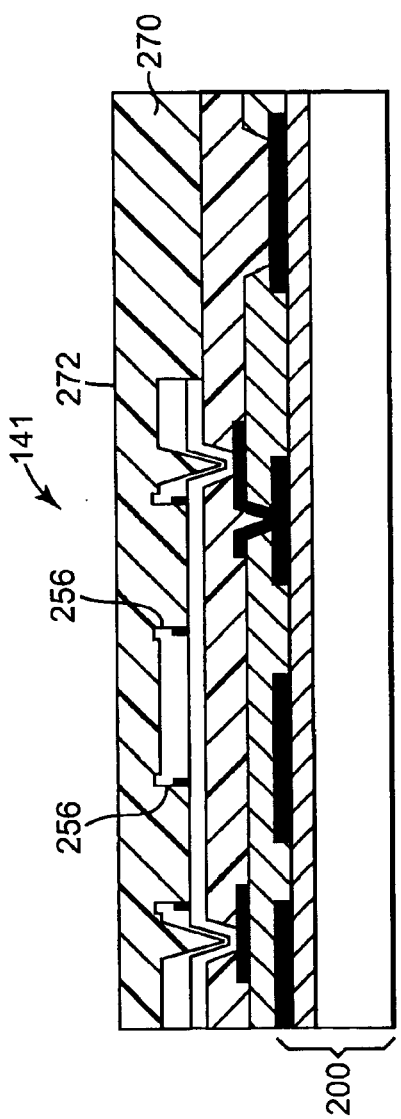
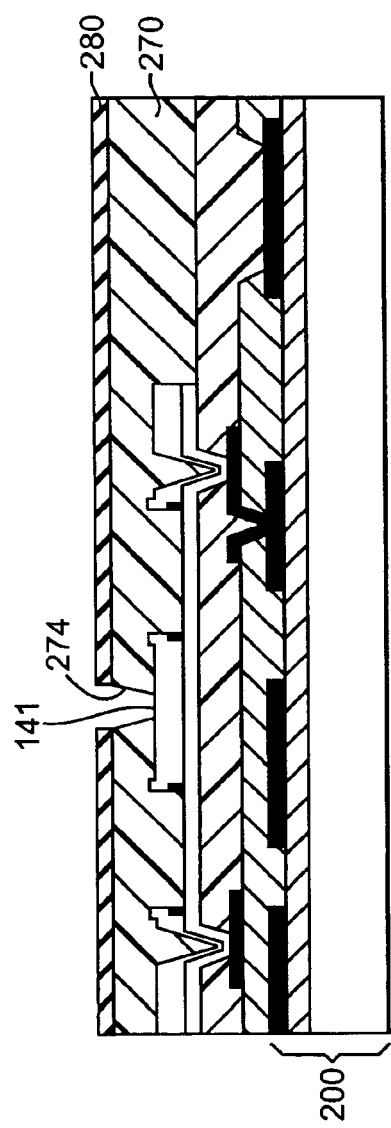

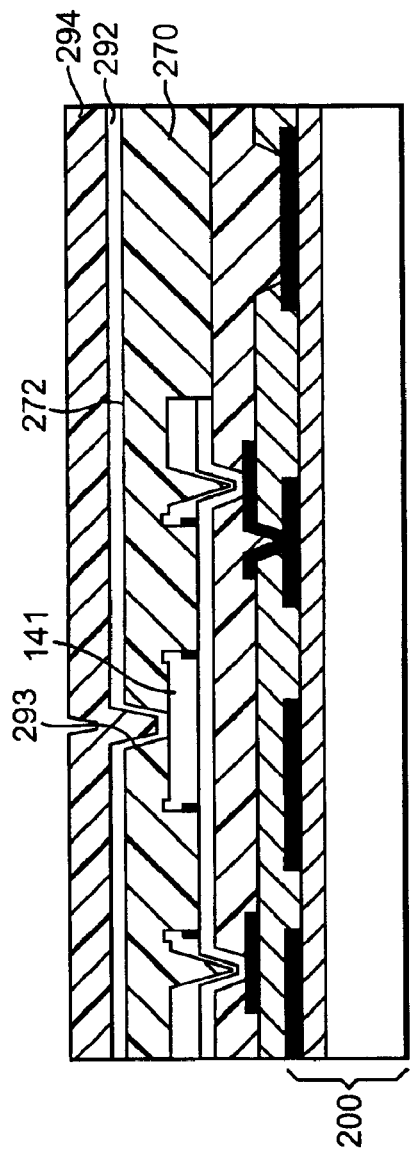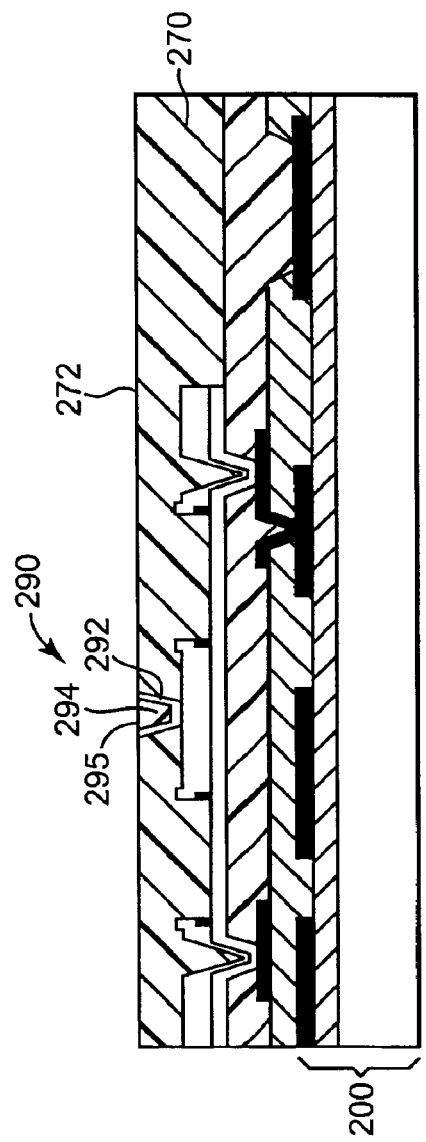

METHOD OF FORMING MEMS DEVICE

BACKGROUND

Microelectromechanical systems or MEMS devices include micromachined substrates integrated with electronic microcircuits. Such devices may form, for example, microsensors or microactuators which operate based on, for example, electromagnetic, electrostrictive, thermoelectric, piezoelectric, or piezoresistive effects. MEMS devices have been formed on insulators or other substrates using microelectronic techniques such as photolithography, vapor deposition, and etching.

An example of a MEMS device includes a micro-mirror device. The micro-mirror device can be operated as a light modulator for amplitude and/or phase modulation of incident light. One application of a micro-mirror device is in a display system. As such, multiple micro-mirror devices are arranged in an array such that each micro-mirror device provides one cell or pixel of the display.

A conventional micro-mirror device includes an electrostatically actuated mirror supported for rotation about an axis of the mirror. As such, rotation of the mirror about the axis may be used to modulate incident light by directing the incident light in different directions. To direct the incident light in different directions, the mirror may include a reflective surface which reflects the incident light. Unfortunately, variations in the reflective surface may lower the reflectivity of the mirror and/or produce light interference, thereby lowering or diminishing a contrast ratio of the mirror.

For these and other reasons, there is a need for the present invention.

SUMMARY

One aspect of the present invention provides a method of forming a MEMS device. The method includes depositing a conductive material on a substructure, forming a first sacrificial layer over the conductive material, including forming a substantially planar surface of the first sacrificial layer, and forming a first element over the substantially planar surface of the first sacrificial layer, including communicating the first element with the conductive material through the first sacrificial layer. In addition, the method includes forming a second sacrificial layer over the first element, including forming a substantially planar surface of the second sacrificial layer, forming a support through the second sacrificial layer to the first element after forming the second sacrificial layer, including filling the support, and forming a second element over the support and the substantially planar surface of the second sacrificial layer. As such, the method further includes substantially removing the first sacrificial layer and the second sacrificial layer, thereby supporting the second element relative to the first element with the support.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
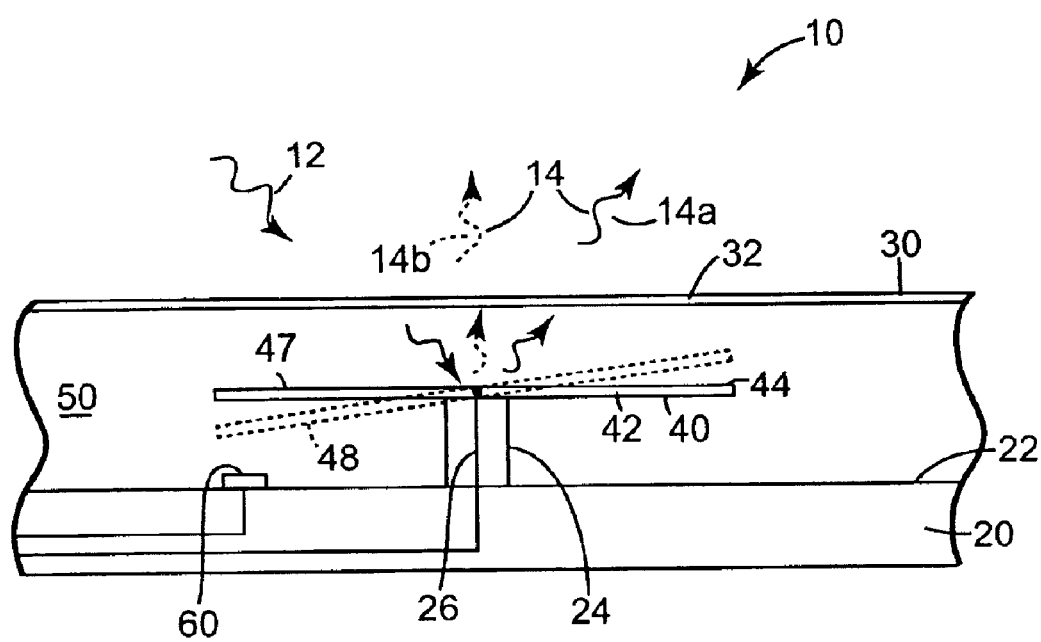
FIG. 1 is a schematic cross-sectional view illustrating one embodiment of a portion of a micro-mirror device according to the present invention.

FIG. 1 illustrates one embodiment of a micro-mirror device 10. Micro-mirror device 10 is a micro-actuator which relies on electrical to mechanical conversion to generate a force and cause movement or actuation of a body or element. In one embodiment, as described below, a plurality of micro-mirror devices 10 are arranged to form an array of micro-mirror devices. As such, the array of micro-mirror devices may be used to form a display. As such, each micro-mirror device 10 constitutes a light modulator for modulation of incident light and provides one cell or pixel of the display. In addition, micro-mirror device 10 may also be used in other imaging systems such as projectors and may also be used for optical addressing.

In one embodiment, as described below, micro-mirror device 10 is formed so as to minimize or reduce variations in a reflective surface of the device. For example, in one embodiment, a reflective element of micro-mirror device 10 is formed with a substantially planar surface over an entirety thereof. As such, reflectivity of micro-mirror device 10 may be enhanced and/or light interference from micro-mirror device 10 may be reduced. Thus, a contrast ratio of micro-mirror device 10 may be improved.

In one embodiment, as illustrated in FIG. 1, micro-mirror device 10 includes a substrate 20, a plate 30, and an actuating element 40. Preferably, plate 30 is oriented substantially parallel to a surface 22 of substrate 20 and spaced from surface 22 so as to define a cavity 50 therebetween. Actuating element 40 is interposed between surface 22 of substrate 20 and plate 30. As such, actuating element 40 is positioned within cavity 50. In one embodiment, actuating element 40 is supported relative to substrate 20 by a support or post 24 extending from surface 22 of substrate 20.

In one embodiment, actuating element 40 is actuated so as to move between a first position 47 and a second position 48 relative to substrate 20 and plate 30. Preferably, actuating element 40 moves or tilts at an angle about an axis of rotation. As such, first position 47 of actuating element 40 is illustrated as being substantially horizontal and substantially parallel to substrate 20 and second position 48 of actuating element 40 is illustrated as being oriented at an angle to first position 47. Movement or actuation of actuating element 40 relative to substrate 20 and plate 30 is described in detail below.

Preferably, plate 30 is a transparent plate 32 and actuating element 40 is a reflective element 42. In one embodiment, transparent plate 32 is a glass plate. Other suitable planar translucent or transparent materials, however, may be used. Examples of such a material include quartz and plastic.

Reflective element 42 includes a reflective surface 44. In one embodiment, reflective element 42 is formed of a uniform material having a suitable reflectivity to form reflective surface 44. Examples of such a material include polysilicon or a metal such as aluminum. In another embodiment, reflective element 42 is formed of a base material such as polysilicon with a reflective material such as aluminum or silver disposed on one or more sides of the base material. In addition, reflective element 42 may be formed of a non-conductive material or may be formed of or include a conductive material.

As illustrated in the embodiment of FIG. 1, micro-mirror device 10 modulates light generated by a light source (not shown) located on a side of transparent plate 32 opposite of substrate 20. The light source may include, for example, ambient and/or artificial light. As such, input light 12, incident on transparent plate 32, passes through transparent plate 32 into cavity 50 and is reflected by reflective surface 44 of reflective element 42 as output light 14. Thus, output light 14 passes out of cavity 50 and back through transparent plate 32.

The direction of output light 14 is determined or controlled by the position of reflective element 42. For example, with reflective element 42 in first position 47, output light 14 is directed in a first direction 14a. However, with reflective element 42 in second position 48, output light 14 is directed in a second direction 14b. Thus, micro-mirror device 10 modulates or varies the direction of output light 14 generated by input light 12. As such, reflective element 42 can be used to steer light into, and/or away from, an optical imaging system.

In one embodiment, first position 47 is a neutral position of reflective element 42 and represents an "ON" state of micro-mirror device 10 in that light is reflected, for example, to a viewer or onto a display screen, as described below. Thus, second position 48 is an actuated position of reflective element 42 and represents an "OFF" state of micro-mirror device 10 in that light is not reflected, for example, to a viewer or onto a display screen.

In one embodiment, reflective element 42 is moved between first position 47 and second position 48 by applying an electrical signal to an electrode 60 formed on substrate 20. In one embodiment, electrode 60 is formed on surface 22 of substrate 20 adjacent an end or edge of reflective element 42. Application of an electrical signal to electrode 60 generates an electric field between electrode 60 and reflective element 42 which causes movement of reflective element 42 between first position 47 and second position 48. Preferably, when the electrical signal is removed from electrode 60, reflective element 42 persists or holds second position 48 for some length of time. Thereafter, restoring forces of reflective element 42 pull or return reflective element 42 to first position 47.

In one embodiment, a conductive via 26 is formed in and extends through post 24. Conductive via 26 is electrically coupled to reflective element 42 and, more specifically, conductive material of reflective element 42. As such, reflective element 42 is moved between first position 47 and second position 48 by applying an electrical signal to electrode 60 and reflective element 42. More specifically, electrode 60 is energized to one polarity and the conductive material of reflective element 42 is energized to an opposite polarity. Thus, application of an electrical signal of one polarity to electrode 60 and an electrical signal of an opposite polarity to reflective element 42 generates an electric field between electrode 60 and reflective element 42 which causes movement of reflective element 42 between first position 47 and second position 48.

In another embodiment, reflective element 42 is moved between first position 47 and second position 48 by applying an electrical signal to reflective element 42. More specifically, the electrical signal is applied to conductive material of reflective element 42 by way of conductive via 26 through post 24. As such, application of an electrical signal to reflective element 42 generates an electric field which causes movement of reflective element 42 between first position 47 and second position 48.

Additional embodiments of actuation of micro-mirror device 10 are described, for example, in U.S. patent application Ser. No. 10/136,719, filed on Apr. 30, 2002, entitled "Micro-Mirror Device", assigned to the assignee of the present invention and incorporated herein by reference.

Figure 2:
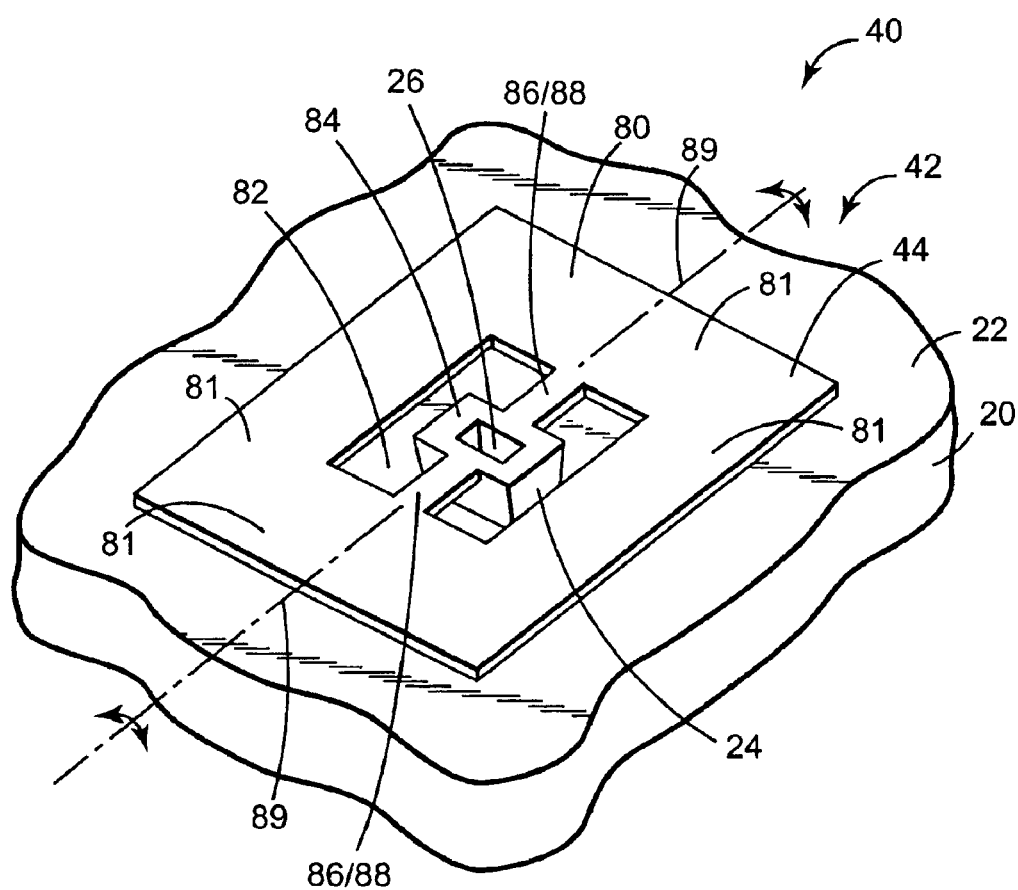
FIG. 2 is a perspective view illustrating one embodiment of a portion of a micro-mirror device according to the present invention.

FIG. 2 illustrates one embodiment of reflective element 42 as an example of actuating element 40. Reflective element 42 has a reflective surface 44 and includes a substantially rectangular-shaped outer portion 80 and a substantially rectangular-shaped inner portion 84. In one embodiment, reflective surface 44 is formed on both outer portion 80 and inner portion 84. Outer portion 80 has four contiguous side portions 81 arranged to form a substantially rectangular-shaped opening 82. As such, inner portion 84 is positioned within opening 82. Preferably, inner portion 84 is positioned symmetrically within opening 82.

In one embodiment, a pair of hinges 86 extend between inner portion 84 and outer portion 80. Hinges 86 extend from opposite sides or edges of inner portion 84 to adjacent opposite sides or edges of outer portion 80. Preferably, outer portion 80 is supported by hinges 86 along an axis of symmetry. More specifically, outer portion 80 is supported about an axis that extends through the middle of opposed edges thereof. As such, hinges 86 facilitate movement of reflective element 42 between first position 47 and second position 48, as described above (FIG. 1). More specifically, hinges 86 facilitate movement of outer portion 80 between first position 47 and second position 48 relative to inner portion 84.

In one embodiment, hinges 86 include torsional members 88 having longitudinal axes 89 oriented substantially parallel to reflective surface 44. Longitudinal axes 89 are collinear and coincide with an axis of symmetry of reflective element 42. As such, torsional members 88 twist or turn about longitudinal axes 89 to accommodate movement of outer portion 80 between first position 47 and second position 48 relative to inner portion 84.

In one embodiment, reflective element 42 is supported relative to substrate 20 by support or post 24 extending from surface 22 of substrate 20. More specifically, post 24 supports inner portion 84 of reflective element 42, and outer portion 80 of reflective element 42 is supported by hinges 86 extending from inner portion 84. In one embodiment, post 24 is formed by conductive via 26 extending through inner portion 84 to a conductive layer of substrate 20.

Figure 3:
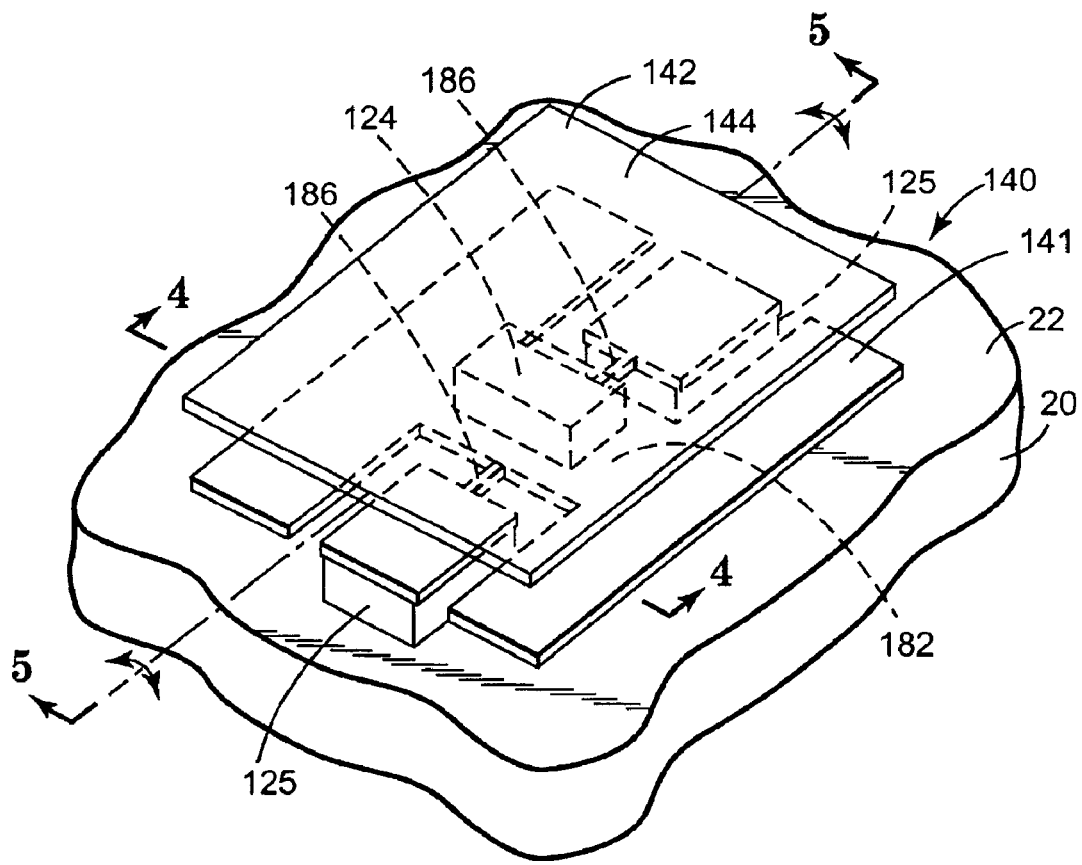
FIG. 3 is a perspective view illustrating another embodiment of a portion of a micro-mirror device according to the present invention.
Figure 4:
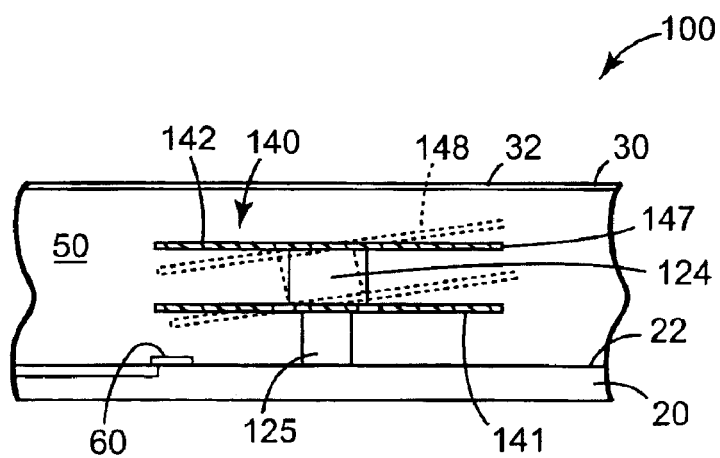
FIG. 4 is a schematic cross-sectional view taken along line 4—4 of FIG. 3 illustrating one embodiment of actuation of a micro-mirror device according to the present invention.

FIGS. 3 and 4 illustrate another embodiment of a micro-mirror device 100. Micro-mirror device 100 is similar to micro-mirror device 10 and includes substrate 20, plate 30, and cavity 50 defined between substrate 20 and plate 30. In one embodiment, plate 30 includes transparent plate 32 and substrate 20 has one or more electrodes 60 formed on surface 22 of substrate 20, as described above.

As illustrated in the embodiments of FIGS. 3 and 4, micro-mirror device 100 includes an actuating element 140 supported between substrate 20 and plate 30. In one embodiment, actuating element 140 includes a hinge element 141 and a reflective element 142. As such, reflective element 142 includes a reflective surface 144. Thus, input light 12 (FIG. 1) is reflected by reflective surface 144 of reflective element 142 in a manner similar to how input light 12 is reflected by reflective surface 44 of reflective element 42, as described above.

In one embodiment, reflective element 142 extends over and is supported from hinge element 141 by a support 124 and hinge element 141 extends over and is supported from substrate 20 by a support 125. In one embodiment, supports 124 and 125 constitute conductive vias extended between reflective element 142 and hinge element 141, and hinge element 141 and substrate 20, respectively.

In one embodiment, as illustrated in FIG. 3, hinge element 141 is supported by a pair of supports 125 and includes a connecting portion or yoke 182 supported from supports 125 by hinges 186. In one embodiment, yoke 182 supports support 124 and, therefore, reflective element 142. As such, hinges 186 accommodate movement of yoke 182 relative to supports 125 so as to facilitate movement of reflective element 142, as described below.

Actuation of micro-mirror device 100 is similar to that of micro-mirror device 10, as described above, with the exception that both hinge element 141 and reflective element 142 of actuating element 140 are actuated. As such, hinge element 141 and reflective element 142 are both moved between a first position 147 and a second position 148 by applying an electrical signal to electrode 60 formed on substrate 20. Application of an electrical signal to electrode 60 generates an electric field between electrode 60 and hinge element 141 and/or reflective element 142 which causes movement of hinge element 141 and reflective element 142 between first position 147 and second position 148.

Figure 5C:
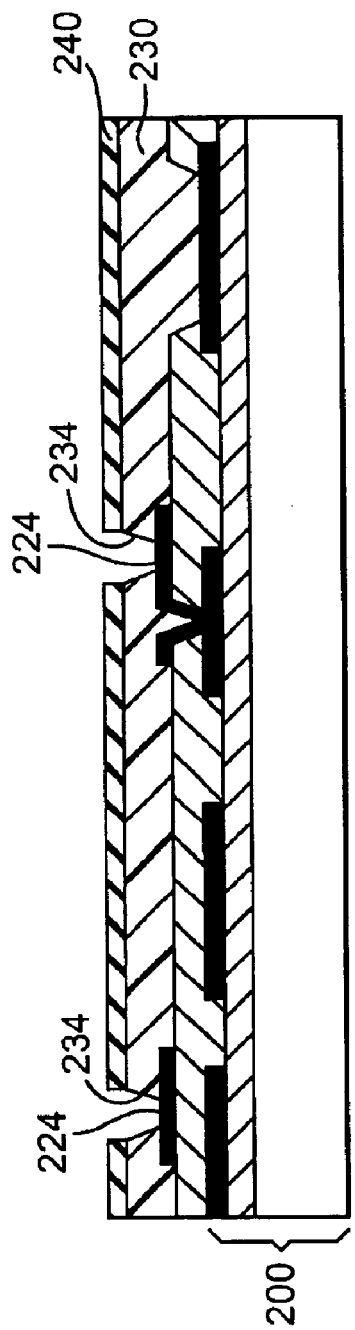
FIGS. 5A–5N illustrate one embodiment of forming a micro-mirror device according to the present invention.
Figure 5D:
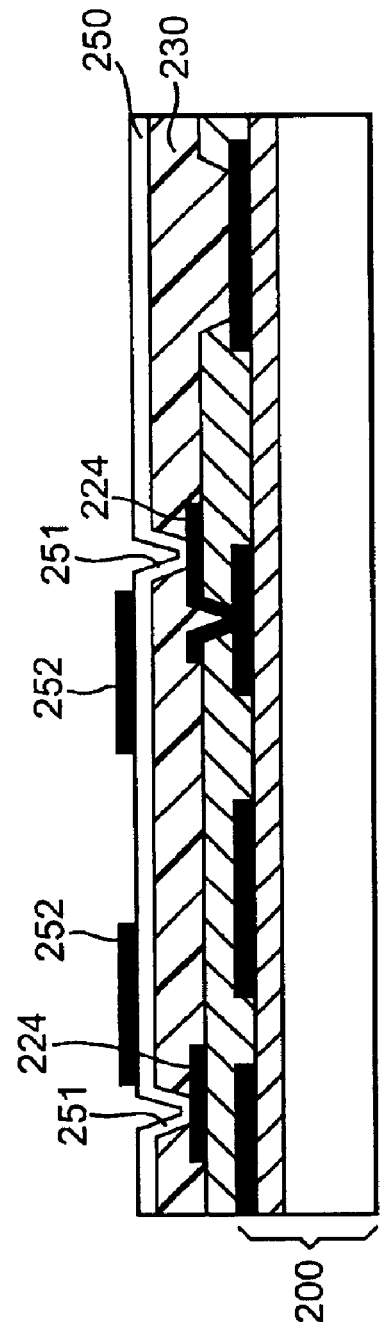
Figure 5K:
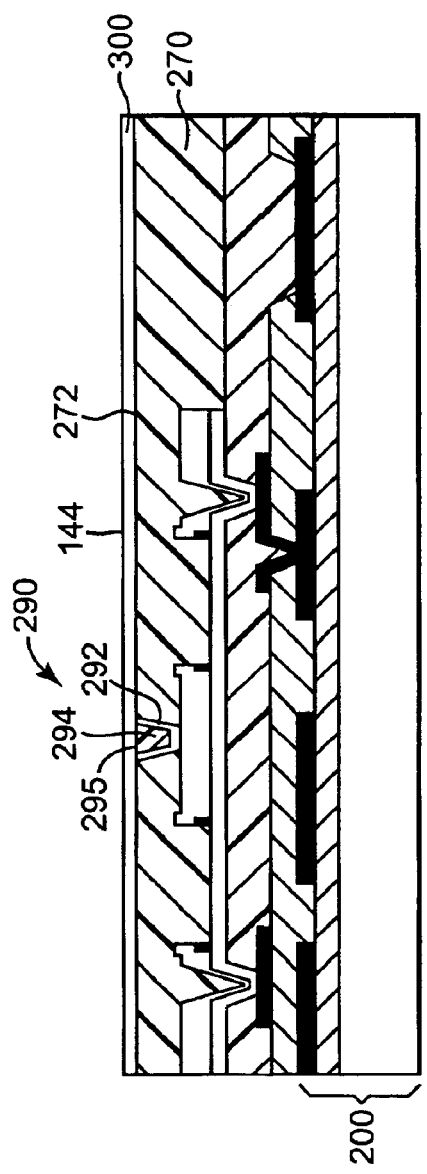
Figure 5L:
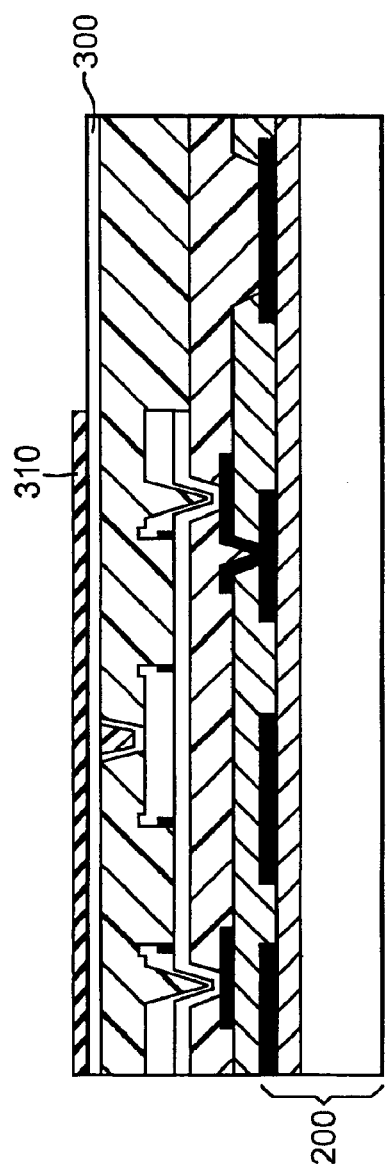
Figure 5M:
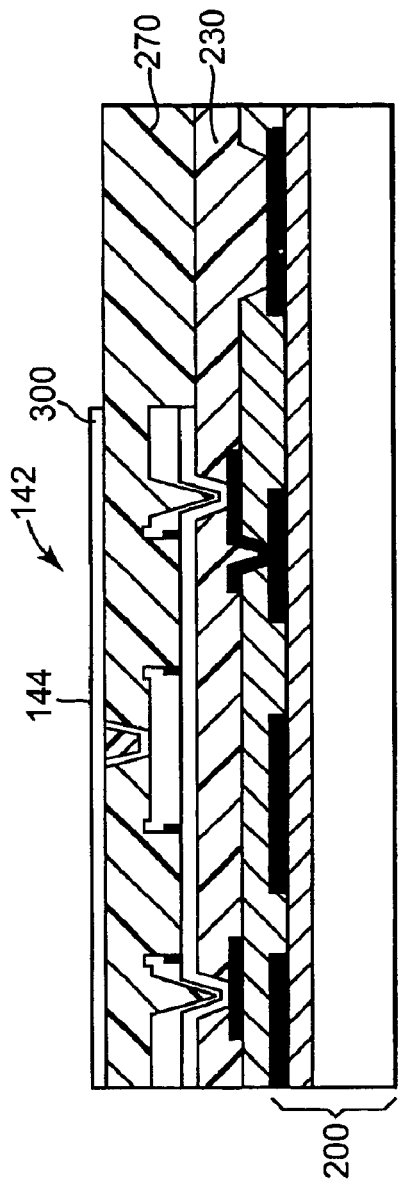
Figure 5N:
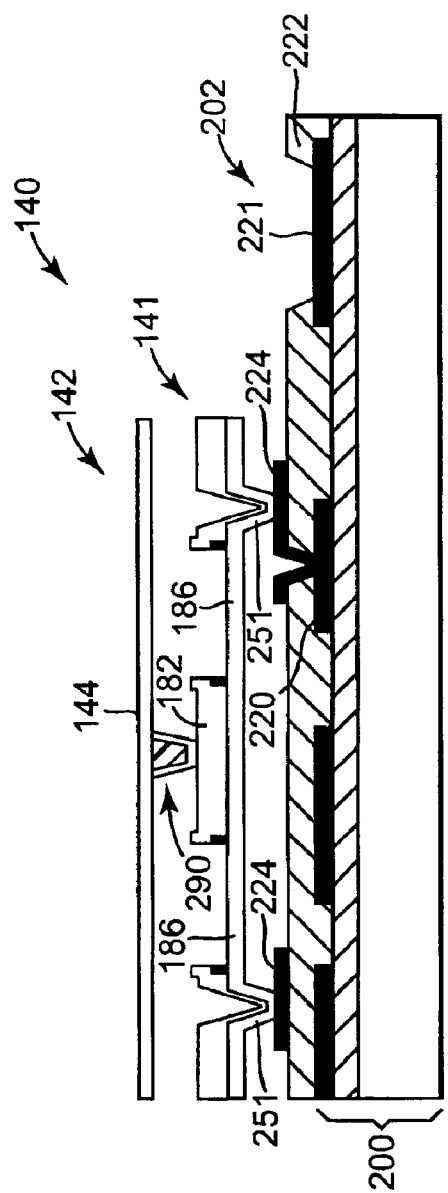

FIGS. 5A–5N illustrate one embodiment of forming micro-mirror device 100, including actuating element 140 of micro-mirror device 100. In one embodiment, as described above, actuating element 140 of micro-mirror device 100 includes hinge element 141 and reflective element 142. As such, FIGS. 5A–5N include one embodiment of forming hinge element 141 and reflective element 142.

In one embodiment, as illustrated in FIG. 5A, micro-mirror device 100 is formed on a substructure 200. In one embodiment, substructure 200 includes a complementary metal oxide semi-conductor (CMOS) structure. As such, substructure 200 includes a base material 210 and at least one conductive layer 220 formed on a first side 212 of base material 210. Conductive layer 220 includes, for example, titanium (Ti), titanium nitride (TiN), copper (Cu), gold (Au), and/or aluminum (Al). Conductive layer 220 is formed, for example, by deposition, and patterned by photolithography and etching.

In one embodiment, substructure 200 includes a dielectric layer 214 formed on first side 212 of base material 210. As such, conductive layer 220 of substructure 200 is formed over dielectric layer 214. Dielectric layer 214 includes, for example, a silicon oxide such as tetraethylorthosilicate (TEOS). In one embodiment, deposited layers of substructure 200 including, for example, dielectric layer 214 are planarized during formation of substructure 200 to create a substantially planar substrate for micro-mirror device 10.

In one embodiment, conductive material of conductive layer 220 forms an electrical contact area 202 of substructure 200 and an actuating area 204 of substructure 200. Electrical contact area 202 defines an area where electrical connection to micro-mirror device 100 is to be made, and actuating area 204 defines an area where actuating element 140 of micro-mirror device 100 is to be formed, as described below. As such, conductive layer 220 of substructure 200 constitutes an interconnect level of the CMOS circuit.

As illustrated in the embodiment of FIG. 5A, to form micro-mirror device 100 on substructure 200, a dielectric layer 222 is formed over conductive layer 220 of substructure 200. As such, dielectric layer 222 forms surface 22 of substrate 20, as described above. In one embodiment, dielectric layer 222 is formed by depositing a dielectric material over conductive layer 220. The dielectric material includes, for example, TEOS or other form of silicon oxide. In one embodiment, the dielectric material of dielectric layer 222 is planarized to create a substantially planar surface on which electrodes 60 are formed, as described below.

After dielectric layer 222 is formed over conductive layer 220, a conductive material 224 is deposited and patterned on dielectric layer 222. In one embodiment, conductive material 224 is deposited and patterned by photolithography and etching within actuating area 204 of substructure 200. As such, conductive material 224 defines electrodes 225 on dielectric layer 222. In one embodiment, conductive material 224 includes aluminum or an aluminum alloy such as an aluminum silicon alloy.

In one embodiment, conductive material 224 communicates with conductive layer 220 of substructure 200 by a conductive via 226 formed through dielectric layer 222. It is understood that FIG. 5A is a schematic representation of substructure 200 and that the actual configuration of conductive layers and conductive vias formed between conductive layers may be more complicated than that illustrated.

In one embodiment, as illustrated in FIG. 5A, conductive material of conductive layer 220 is patterned to form an electrical contact pad 221 for micro-mirror device 100. Electrical contact pad 221 is formed, for example, in electrical contact area 202 of substructure 200. As such, an opening 223 is formed through dielectric layer 222 to electrical contact pad 221. Thus, electrical contact pad 221 provides a point for electrical connection for micro-mirror device 100.

As illustrated in the embodiment of FIG. 5B, to form actuating element 140 of micro-mirror device 100, a sacrificial layer 230 is formed over conductive material 224 and dielectric layer 222, including within opening 223. In one embodiment, sacrificial layer 230 is formed by depositing a sacrificial material over conductive material 224 and dielectric layer 222. The material forming sacrificial layer 230 is deposited, for example, by chemical vapor deposition (CVD) or plasma enhanced CVD (PECVD), or is spun on. In one embodiment, the material forming sacrificial layer 230 includes, for example, silicon, an oxide, such as TEOS, or photoresist. Sacrificial layer 230 is sacrificial in that the material forming sacrificial layer 230 is substantially removed during subsequent processing while forming actuating element 140, as described below.

After the material of sacrificial layer 230 is deposited over conductive material 224 and dielectric layer 222, the material is planarized to create a substantially planar surface 232 of sacrificial layer 230. In one embodiment, the material of sacrificial layer 230 is planarized by a chemical mechanical polishing (CMP) process.

Next, as illustrated in the embodiment of FIG. 5C, a mask layer 240 is formed over sacrificial layer 230. In one embodiment, mask layer 240 is formed by deposition and patterned, for example, by photolithography or etching to expose areas of sacrificial layer 230 and define where openings 234 are to be formed through sacrificial layer 230 to conductive material 224.

In one embodiment, openings 234 through sacrificial layer 230 are formed by chemical etching. Thus, mask layer 240 is formed of a material which is resistant to the etchant used for etching openings 234. Examples of a material suitable for mask layer 240 include a hard mask material such as silicon dioxide or silicon nitride, or a photoimageable material such as photoresist. After openings 234 are formed, mask layer 240 is stripped or removed.

As illustrated in the embodiments of FIGS. 5D–5F, after openings 234 are formed through sacrificial layer 230 and mask layer 240 is removed, hinge element 141 of actuating element 140 is formed. Hinge element 141 is formed, for example, by depositing one or more layers of one or more materials over sacrificial layer 230, and patterning the materials to define hinge element 141. The materials are deposited, for example, by physical vapor deposition (PVD), CVD, or PECVD, and patterned, for example, by photolithography and etching.

As illustrated in the embodiment of FIG. 5D, hinge element 141 of actuating element 140 is formed by depositing a first material 250 over sacrificial layer 230 and within openings 234 of sacrificial layer 230. In one embodiment, material 250 which is deposited within openings 234 forms conductive vias 251 through sacrificial layer 230 to conductive material 224. Thus, material 250 includes a conductive material. In one embodiment, for example, material 250 includes aluminum or an aluminum alloy such as an aluminum silicon alloy.

In one embodiment, conductive vias 251 form posts 125 (FIGS. 3 and 4) of micro-mirror device 100. As such, conductive vias 251 support hinge element 141 relative to substructure 200, as described below. In addition, in one embodiment, material 250 constitutes hinge material of hinge element 141 and forms hinges 186 (FIG. 3) of micro-mirror device 100.

In one embodiment, as illustrated in FIG. 5D, after material 250 is deposited over sacrificial layer 230, a protective material 252 is deposited and patterned on material 250. In one embodiment, protective material 252 is deposited by deposition and patterned by photolithography and etching to define where hinges 186 (FIG. 3) of micro-mirror device 100 are to be formed. More specifically, protective material 252 is patterned to protect areas of material 250 which form hinges 186, as described below. In one embodiment, protective material 252 includes TEOS or other form of silicon oxide.

Next, as illustrated in the embodiment of FIG. 5E, hinge element 141 is further formed by depositing a second material 254 over protective material 252 and material 250. In one embodiment, material 254 constitutes yoke material of hinge element 141 and forms yoke 182 (FIG. 3) of micro-mirror device 100. In one embodiment, for example, material 254 includes aluminum or an aluminum alloy such as an aluminum silicon alloy.

In one embodiment, as illustrated in FIG. 5E, after material 254 is deposited over protective material 252 and material 250, a mask layer 260 is formed over material 254. In one embodiment, mask layer 260 is formed by deposition and patterned, for example, by photolithography or etching to form openings 262 in mask layer 260 and expose areas of material 254. As such, the exposed areas of material 254 include areas which define where material 254 and protective material 252 are to be removed to form hinges 186 (FIG. 3) of hinge element 141. In one embodiment, a dimension D1 of openings 262 is less than a dimension D2 of protective material 252. As such, protective material 252 protects material 250 during forming of hinges 186, as described below.

As illustrated in the embodiment of FIG. 5F, hinges 186 are formed by forming openings 256 through material 254 and protective material 252 to material 250. In one embodiment, openings 256 are formed by chemical etching through openings 262 of mask layer 260. As such, protective material 252 protects and/or controls etching into material 250. After openings 256 are formed, mask layer 260 is stripped or removed.

Next, as illustrated in the embodiment of FIG. 5G, after hinge element 141 is formed, a sacrificial layer 270 is formed over hinge element 141, including within openings 256. In one embodiment, sacrificial layer 270 is formed by depositing a sacrificial material over hinge element 141. The material forming sacrificial layer 270 is deposited, for example, by CVD or PECVD, or spun on. In one embodiment, the material forming sacrificial layer 270 includes, for example, silicon, an oxide, such as TEOS, or photoresist. Sacrificial layer 270 is sacrificial in that the material forming sacrificial layer 270 is substantially removed during subsequent processing while forming actuating element 140, as described below.

After the material of sacrificial layer 270 is deposited over hinge element 141, the material is planarized to create a substantially planar surface 272 of sacrificial layer 270. In one embodiment, the material of sacrificial layer 270 is planarized by a CMP process.

Next, as illustrated in the embodiment of FIG. 5H, a mask layer 280 is formed over sacrificial layer 270. In one embodiment, mask layer 280 is formed by deposition and patterned, for example, by photolithography to expose an area of sacrificial layer 270 and define where an opening 274 is to be formed through sacrificial layer 270 to hinge element 141.

In one embodiment, opening 274 through sacrificial layer 270 is formed by chemical etching. Thus, mask layer 280 is formed of a material which is resistant to the etchant used for etching opening 274. Examples of a material suitable for mask layer 280 include a hard mask material such as silicon dioxide or silicon nitride, or a photoimageable material such as photoresist. After opening 274 is formed, mask layer 280 is stripped or removed.

As illustrated in the embodiments of FIGS. 5I and 5J, after opening 274 is formed through sacrificial layer 270 and mask layer 280 is removed, a plugged via 290 is formed in sacrificial layer 270. In one embodiment, plugged via 290 is conductive and forms post 124 (FIGS. 3 and 4) of micro-mirror device 100. As such, plugged via 290 provides conductivity between hinge element 141 and reflective element 142, and supports reflective element 142 relative to hinge element 141, as described below.

In one embodiment, as illustrated in FIG. 5I, plugged via 290 is formed by depositing a protective material 292 over surface 272 of sacrificial layer 270 and within opening 274 of sacrificial layer 270. As such, protective material 292 contacts hinge element 141 and, in one embodiment, forms a conductive via 293 through sacrificial layer 270 to hinge element 141. Thus, in one embodiment, protective material 292 includes a conductive material. In one embodiment, for example, protective material 292 includes aluminum.

As illustrated in the embodiment of FIG. 5I, after protective material 292 is deposited over surface 272 and within opening 274 (FIG. 5H) of sacrificial layer 270, a plug material 294 is deposited over protective material 292, including within opening 274. As such, plug material 294 fills conductive via 293. In addition, protective material 292 protects plug material 294 during subsequent processing while forming actuating element 140, as described below.

In one embodiment, plug material 294 includes, for example, silicon, an oxide, such as TEOS, a metal, such as aluminum, copper, titanium, or tungsten, or photoresist. In one exemplary embodiment, when sacrificial layers 230 and 270 are formed of silicon, a suitable material for plug material 294 includes silicon, an oxide, a metal, or photoresist. In another exemplary embodiment, when sacrificial layers 230 and 270 are formed of photoresist, a suitable material for plug material 294 includes photoresist.

Next, as illustrated in the embodiment of FIG. 5J, plug material 294 and protective material 292 are planarized. In one embodiment, plug material 294 and protective material 292 are planarized to sacrificial layer 270 so as to produce a substantially planar surface 295 of plug material 294 and recreate or reestablish substantially planar surface 272 of sacrificial layer 270. In one embodiment, plug material 294 and protective material 292 are planarized by a CMP process.

As illustrated in the embodiments of FIGS. 5K–5M, after substantially planar surface 272 of sacrificial layer 270 is formed, reflective element 142 of actuating element 140 is formed. Reflective element 142 is formed, for example, by depositing one or more layers of one or more materials over sacrificial layer 270 and plugged via 290, and patterning the materials to define reflective element 142. The materials are deposited, for example, by PVD, CVD, or PECVD, and patterned, for example, by photolithography and etching.

In one embodiment, as illustrated in FIG. 5K, reflective element 142 of actuating element 140 is formed by depositing material 300 over sacrificial layer 270 and plugged via 290. More specifically, material 300 is deposited on substantially planar surface 272 of sacrificial layer 270 and substantially planar surface 295 of plug material 294. As such, reflective element 142 is formed with a substantially planar surface. More specifically, an entire surface of reflective element 142 is substantially planar.

In one embodiment, material 300 constitutes reflective material of reflective element 142 and forms reflective surface 144 of reflective element 142. Thus, material 300 includes a reflective material. In one embodiment, for example, material 300 includes aluminum.

As illustrated in the embodiment of FIG. 5K, reflective element 142 is formed so as to contact plug material 294 of plugged via 290. As such, plug material 294 of plugged via 290 is enclosed by material 300 of reflective element 142 and protective material 292 of plugged via 290. Thus, plug material 294 is protected during subsequent processing while forming actuating element 140, as described below.

In one embodiment, as illustrated in FIG. 5L, after material 300 is deposited over sacrificial layer 270 and plugged via 290, a mask layer 310 is formed over material 300. In one embodiment, mask layer 310 is formed by deposition and patterned, for example, by photolithography to expose areas of material 300 and define reflective element 142. Examples of material suitable for mask layer 310 include a hard mask material such as silicon dioxide or silicon nitride, or a photoimageable material such as photoresist.

As illustrated in the embodiment of FIG. 5M, the exposed areas of material 300 are removed to define reflective element 142. In one embodiment, the exposed areas of material 300 are removed by chemical etching. As such, mask layer 310 protects reflective surface 144 of reflective element 142. After the exposed areas of material 300 are removed, mask layer 310 is stripped or removed.

Next, as illustrated in the embodiment of FIG. 5N, sacrificial layers 230 and 270 are substantially removed. More specifically, the material of sacrificial layer 230 is removed from between hinge element 141 and conductive material 224 and dielectric layer 222, and the material of sacrificial layer 270 is removed from between reflective element 142 and hinge element 141. Thus, actuating element 140, including hinge element 141 and reflective element 142 is released. As such, hinge element 141, including yoke 182 and hinges 186, is supported from substructure 200 by conductive vias 251, and reflective element 142, including reflective surface 144, is supported from hinge element 141 by plugged via 290. In addition, electrical contact pad 221 of electrical contact area 202 is exposed.

In one embodiment, sacrificial layers 230 and 270 are removed by a chemical etch process. As such, conductive layer 220, dielectric layer 222, conductive material 224, and the materials of actuating element 140 are selected so as to be resistant to the particular etchant used for removing sacrificial layers 230 and 270. In one embodiment, the etch process for removing sacrificial layers 230 and 270 is a dry etch, such as a plasma-based fluorinated etch using, for example, $SF_6$, $CF_4$, $C_2F_6$, or a combination of gases.

While the above description refers to the formation of a micro-mirror device, it is understand that the above processes are also applicable to the formation of other MEMS devices, including multi-layer MEMS devices. In addition, it is understood that FIGS. 5A–5N are schematic illustrations of one embodiment of forming a micro-mirror device according to the present invention and that the actual configuration of layers and vias of the micro-mirror device may be more complicated than that illustrated.

Figure 6:
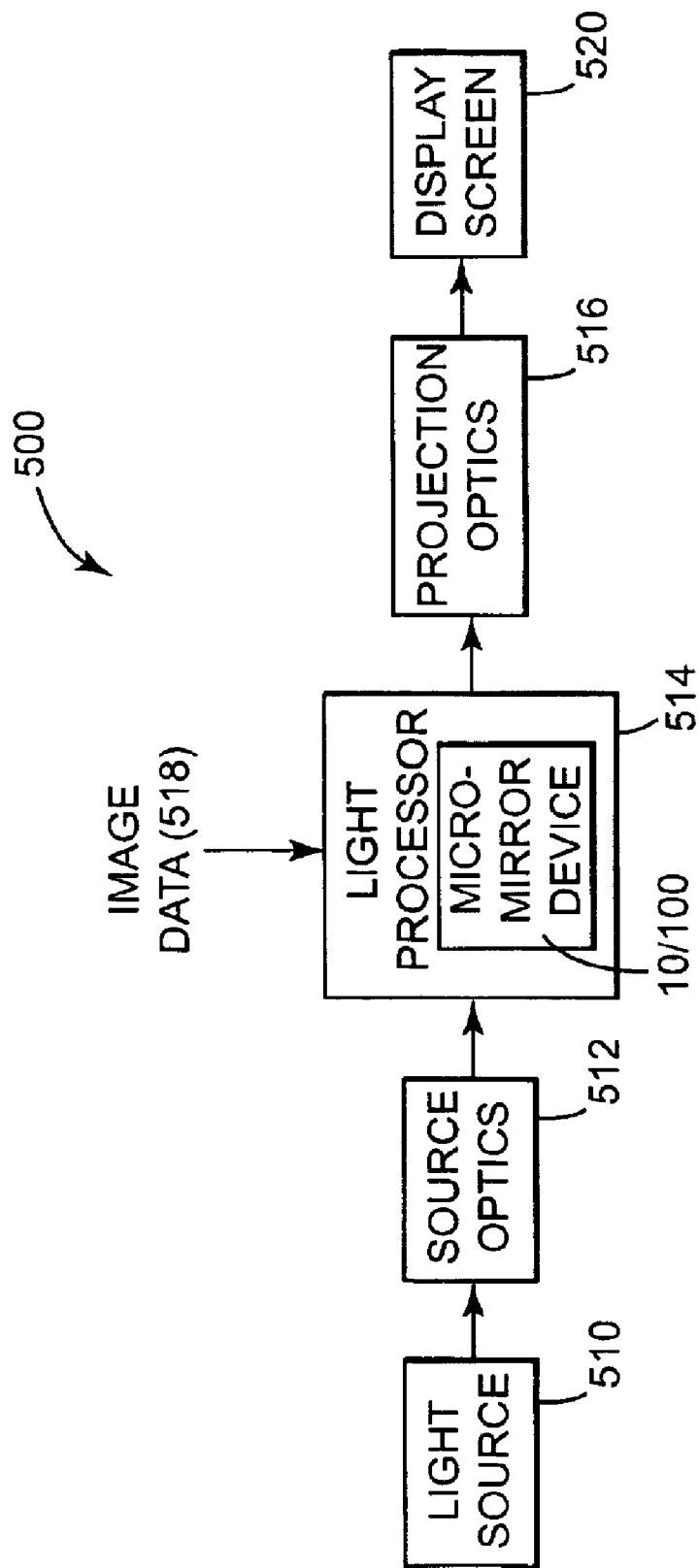
FIG. 6 is a block diagram illustrating one embodiment of a display system including a micro-mirror device according to the present invention.

In one embodiment, as illustrated in FIG. 6, micro-mirror device 10 (including micro-mirror device 100) is incorporated in a display system 500. Display system 500 includes a light source 510, source optics 512, a light processor or controller 514, and projection optics 516. Light processor 514 includes multiple micro-mirror devices 10 arranged in an array such that each micro-mirror device 10 constitutes one cell or pixel of the display.

In one embodiment, light processor 514 receives image data 518 representing an image to be displayed. As such, light processor 514 controls the actuation of micro-mirror devices 10 and the modulation of light received from light source 510 based on image data 518. The modulated light is then projected to a viewer or onto a display screen 520.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a MEMS device, the method comprising:
    depositing a conductive material on a substructure;
    forming a first sacrificial layer over the conductive material, including forming a substantially planar surface of the first sacrificial layer;
    forming a first element over the substantially planar surface of the first sacrificial layer, including communicating the first element with the conductive material through the first sacrificial layer;
    forming a second sacrificial layer over the first element, including forming a substantially planar surface of the second sacrificial layer;
    forming a support through the second sacrificial layer to the first element after forming the second sacrificial layer, including filling the support;
    forming a second element over the support and the substantially planar surface of the second sacrificial layer; and
    substantially removing the first sacrificial layer and the second sacrificial layer, including supporting the second element relative to the first element with the support.

2. The method of claim 1, wherein forming the second element includes forming the second element with a substantially planar surface over an entirety thereof.

3. The method of claim 1, wherein forming the first element includes forming openings in the first sacrificial layer to the conductive material, depositing a first material within the openings and on the substantially planar surface of the first sacrificial layer, depositing and patterning a protective material on the first material, and depositing a second material on the protective material and the first material, and includes removing a portion of the second material and the protective material to expose a portion of the first material.

4. The method of claim 1, wherein forming the support includes forming an opening through the second sacrificial layer to the first element, depositing a protective material within the opening, and filling the opening with a plug material.

5. The method of claim 4, wherein forming the opening through the second sacrificial layer includes etching the second sacrificial layer.

6. The method of claim 1, wherein filling the support includes filling the support with a plug material, and wherein forming the second element includes contacting the plug material with the second element.

7. The method of claim 1, wherein substantially removing the first sacrificial layer and the second sacrificial layer includes etching the first sacrificial layer and the second sacrificial layer.

8. The method of claim 7, wherein etching the first sacrificial layer and the second sacrificial layer includes dry etching the first sacrificial layer and the second sacrificial layer.

9. The method of claim 1, wherein forming the first sacrificial layer includes depositing one of silicon, an oxide, and photoresist over the conductive material.

10. The method of claim 1, wherein forming the second sacrificial layer includes depositing one of silicon, an oxide, and photoresist over the first element.

11. The method of claim 1, wherein filling the support includes depositing one of silicon, an oxide, a metal, and photoresist within the support.

12. The method of claim 1, wherein the substructure includes a base material and at least one conductive layer formed on the base material, and wherein depositing the conductive material on the substructure includes communicating the conductive material with the at least one conductive layer of the substructure.

13. The method of claim 12, wherein the base material of the substructure includes silicon and the at least one conductive layer of the substructure includes aluminum.

14. The method of claim 1, wherein the substructure includes a complementary metal oxide semi-conductor structure.

15. A method of forming a micro-mirror device, the method comprising:
    depositing a conductive material on a substructure;
    forming a first layer of sacrificial material over the conductive material;
    forming a hinge element over the first layer of sacrificial material, including communicating the hinge element with the conductive material through the first layer of sacrificial material;
    forming a second layer of sacrificial material over the hinge element;
    forming a plugged via through the second layer of sacrificial material to the hinge element after forming the second layer of sacrificial material;
    forming a reflective element over the plugged via and the second layer of sacrificial material; and
    substantially removing the first layer and the second layer of sacrificial material, including supporting the reflective element relative to the hinge element with the plugged via.

16. The method of claim 15, wherein forming the reflective element includes forming the reflective element with a substantially planar surface over an entirety thereof.

17. The method of claim 15, wherein forming the hinge element includes forming openings in the first layer of sacrificial material to the conductive material, depositing a first material within the openings and over the first layer of sacrificial material, depositing and patterning a protective material on the first material, and depositing a second material over the protective material and the first material, and includes removing a portion of the second material and the protective material to expose a portion of the first material.

18. The method of claim 15, wherein forming the plugged via includes forming an opening through the second layer of sacrificial material to the hinge element, depositing a protective material within the opening, and filling the opening with a plug material.

19. The method of claim 18, wherein forming the opening through the second layer of sacrificial material includes etching the second layer of sacrificial material.

20. The method of claim 18, wherein forming the reflective element includes contacting the plug material of the plugged via with the reflective element.

21. The method of claim 18, wherein the plug material of the plugged via includes one of silicon, an oxide, a metal, and photoresist.

22. The method of claim 15, wherein substantially removing the first layer and the second layer of sacrificial material includes etching the first layer and the second layer of sacrificial material.

23. The method of claim 22, wherein etching the first layer and the second layer of sacrificial material includes dry etching the first layer and the second layer of sacrificial material.

24. The method of claim 15, wherein the sacrificial material includes one of silicon, an oxide, and photoresist.

25. The method of claim 15, wherein the substructure includes a base material and at least one conductive layer formed on the base material, and wherein depositing the conductive material on the substructure includes communicating the conductive material with the at least one conductive layer of the substructure.

26. The method of claim 25, wherein the base material of the substructure includes silicon and the at least one conductive layer of the substructure includes aluminum.

27. The method of claim 15, wherein the substructure includes a complementary metal oxide semi-conductor structure.

* * * * *